US010541624B2

(12) United States Patent
Ishino et al.

(10) Patent No.: US 10,541,624 B2
(45) Date of Patent: Jan. 21, 2020

(54) THREE-LEVEL I-TYPE INVERTER AND SEMICONDUCTOR MODULE

(71) Applicant: Mitsubishi Electric Corporation, Tokyo (JP)

(72) Inventors: Masaaki Ishino, Tokyo (JP); Nobuya Nishida, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/184,254

(22) Filed: Nov. 8, 2018

(65) Prior Publication Data

US 2019/0267912 A1    Aug. 29, 2019

(30) Foreign Application Priority Data

Feb. 27, 2018   (JP) ................................. 2018-033003

(51) Int. Cl.
*H02M 7/5387* (2007.01)
*H01L 27/06* (2006.01)
*H01L 23/00* (2006.01)

(52) U.S. Cl.
CPC .......... *H02M 7/5387* (2013.01); *H01L 24/42* (2013.01); *H01L 27/0647* (2013.01); *H01L 2924/12032* (2013.01); *H01L 2924/13055* (2013.01); *H01L 2924/14252* (2013.01)

(58) Field of Classification Search
CPC ..................................................... H02M 7/53
See application file for complete search history.

(56) References Cited

U.S. PATENT DOCUMENTS

| 2015/0016169 A1* | 1/2015 | Honea ................. H02M 7/5387 363/132 |
| 2015/0124505 A1* | 5/2015 | Wang .................... H02M 7/219 363/126 |
| 2017/0324353 A1* | 11/2017 | Viitanen ............... H02M 1/083 |

FOREIGN PATENT DOCUMENTS

JP    2003-070262 A    3/2003

\* cited by examiner

*Primary Examiner* — Jue Zhang
*Assistant Examiner* — Trinh Q Dang
(74) *Attorney, Agent, or Firm* — Studebaker & Brackett PC

(57) ABSTRACT

A three-level I-type inverter includes first to fourth switching devices between first and second potentials, first to fourth diodes, and fifth and sixth diodes. The first to fourth diodes are respectively connected to the first to fourth switching devices in anti-parallel. Between a connection node of the first and second switching devices and a connection node of the third and fourth switching devices, the fifth and sixth diodes are connected in series and in anti-parallel with series connection of the second and third switching devices. A connection node of the fifth and sixth diodes is connected to an input node having intermediate potential. A connection node of the second and third switching devices is connected to an output node. The second switching device and diode are formed of a first reverse conducting IGBT. The third switching device and diode are formed of a second reverse conducting IGBT.

3 Claims, 18 Drawing Sheets

MD1: $V_{out}=0$

MD2: $V_{out}=V_{cc}/2$

MD7: $V_{out} = -V_{cc}$

THREE-LEVEL I-TYPE INVERTER AND SEMICONDUCTOR MODULE

BACKGROUND OF THE INVENTION

Field of the Invention

The present invention relates to a three-level I-type inverter, more particularly, to a three-level inverter in which temperature rise is suppressed.

Description of the Background Art

As a three-level I-type inverter of the related art, for example, Japanese Patent Application Laid-Open No. 2003-70262 discloses a technology of using a reverse conducting insulated gate bipolar transistor (RC-IGBT) to form a switching device and a diode that is connected in anti-parallel with the switching device.

In an RC-IGBT, an IGBT and a diode serving as a freewheeling diode are integrated in one chip, and the RC-IGBT thus has an advantage capable of reducing an area occupied by a chip in a semiconductor device, as compared to a case of providing an IGBT and a freewheeling diode in separate chips. Focusing on such an advantage, the related art uses RC-IGBTs.

There has been a problem in that switching characteristics of an RC-IGBT are less satisfactory than switching characteristics of an individual IGBT. In some cases where reduction of an area occupied by a chip is not particularly necessary, such as in a case where a semiconductor device has enough room, RC-IGBTs occasionally have not been positively used because of a small benefit of using an RC-IGBT and of cost effectiveness. Incidentally, the RC-IGBT, in which an IGBT and a diode are integrated in one chip, has an area larger than the entire area of a chip of an individual IGBT, and accordingly has a large heat dissipation area. Therefore, the RC-IGBT has another advantage of having a high cooling effect since the RC-IGBT more easily dissipates heat generated in the IGBT region, as compared to an individual IGBT.

In some conditions where the usage of RC-IGBTs may not be promoted, however, there has been another problem in that such advantages of the RC-IGBT may not be fully utilized.

SUMMARY

It is an object of the present invention to provide a three-level I-type inverter in which chip temperature rise is suppressed.

According to the present invention, a three-level I-type inverter includes first, second, third, and fourth switching devices, first, second, third, and fourth diodes, and fifth and sixth diodes. Between a first main power-supply node supplied with first potential and a second main power-supply node supplied with second potential that is lower than the first potential, the first, second, third, and fourth switching devices are connected in series in mentioned order from the first potential side. The first, second, third, and fourth diodes are respectively connected to the first, second, third, and fourth switching devices in anti-parallel. Between a connection node of the first and second switching devices and a connection node of the third and fourth switching devices, the fifth and sixth diodes are connected in series and in anti-parallel with the series connection of the second and third switching devices. A connection node of the fifth and sixth diodes is connected to an input node that is supplied with intermediate potential between the first potential and the second potential. A connection node of the second and third switching devices is connected to an output node. The second switching device and the second diode are respectively formed of an IGBT and a diode that are included in a first reverse conducting IGBT. The third switching device and the third diode are respectively formed of an IGBT and a diode that are included in a second reverse conducting MT.

According to the three-level I-type inverter, the second switching device and the second diode are respectively formed of an IGBT and a diode included in the first reverse conducting IGBT, and the third switching device and the third diode are respectively formed of an IGBT and a diode included in the second reverse conducting IGBT. Therefore, the area for dissipating heat generated due to steady-state losses can be increased, and chip temperature rise can be suppressed.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

<Device Configuration>

Figure 1:
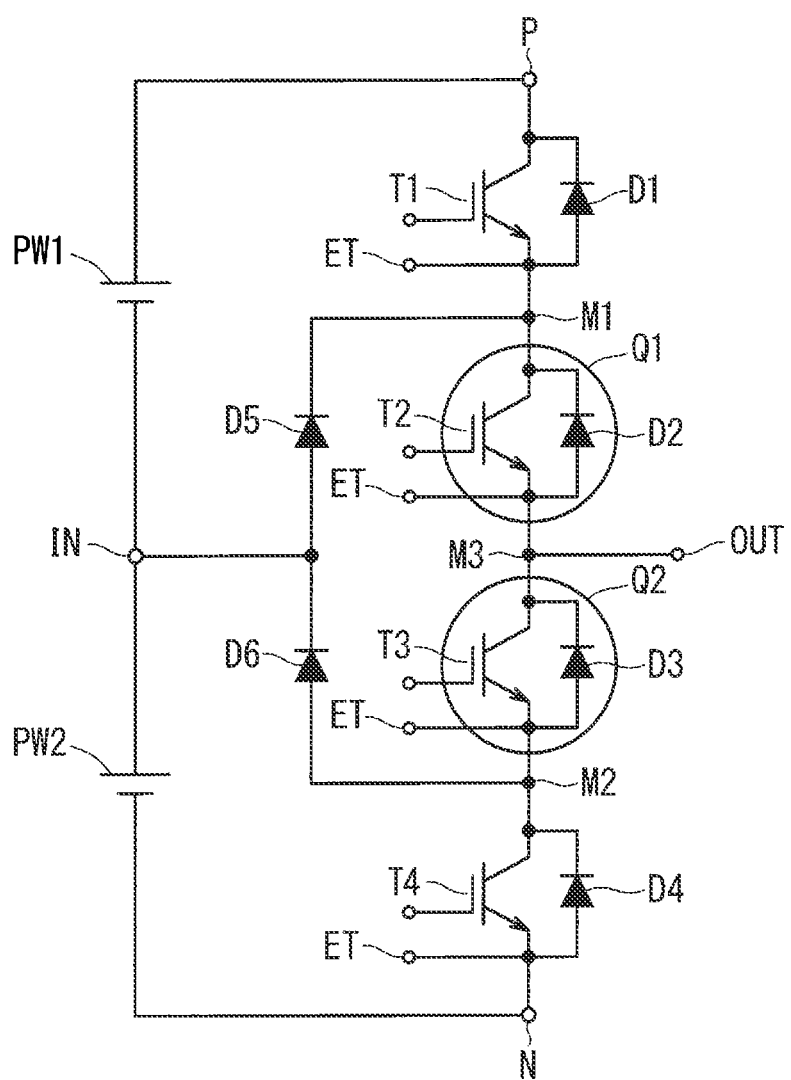
FIG. 1 is a circuit diagram showing a half-bridge circuit of a three-level I-type inverter according to a first preferred embodiment of the present invention.

FIG. 1 is a circuit diagram showing a half-bridge circuit 90 of a three-level I-type inverter according to a first preferred embodiment of the present invention. As shown in FIG. 1, in the half-bridge circuit 90 of the three-level I-type inverter, electric power is supplied by power supplies PW1 and PW2 that are connected in series. Transistors T1, Q1, Q2, and T4 (first, second, third, and fourth switching devices, respectively) are connected in series in the mentioned order from a high potential side between a main power-supply node P (a first main power-supply node) having high potential (first potential) and connected to a positive electrode of the power supply PW1 and a main power-supply node N (a second main power-supply node) having low potential (second potential) and connected to a negative electrode of the power supply PW2.

The transistors T1 and T4 are insulated gate bipolar transistors (IGBTs), and the transistors Q1 and Q2 are reverse conducting IGBTs (RC-IGBTs).

A collector of the transistor T1 is connected to the main power-supply node P, an emitter thereof is connected to a collector of the transistor Q1 (a first reverse conducting IGBT). An emitter of the transistor Q1 is connected to a collector of the transistor Q2 (a second reverse conducting IGBT). An emitter of the transistor Q2 is connected to a collector of the transistor T4. An emitter of the transistor T4 is connected to the main power-supply node N.

Between a connection node M1 of the transistor T1 and the transistor Q1 and a connection node M2 of the transistor Q2 and the transistor T4, diodes D5 and D6 (fifth and sixth diodes) are connected in anti-parallel with the series connection of the transistors Q1 and Q2. Note that, the diodes D5 and D6 serve as clamp diodes.

A connection node of the diodes D5 and D6 is connected to an input node IN. The input node IN serves as a connection node of the power supply PW1 and the power supply PW2, and is supplied with intermediate potential between the high potential and the low potential. Further, a connection node M3 of the transistor Q1 and the transistor Q2 is connected to an output node OUT of the half-bridge circuit 90.

Diodes D1 and D4 (first and fourth diodes) are respectively connected to the transistors T1 and T4 in anti-parallel, and are connected to the transistors T1 and T4 as external diodes.

Meanwhile, the transistors Q1 and Q2 respectively include transistors T2 and T3 each being an IGBT, and diodes D2 and D3 (second and third diodes) are respectively connected to the transistors T2 and T3 in anti-parallel. The diodes D2 and D3 are built-in diodes formed in the same chip as the respective transistors T2 and T3. As in the above description, an RC-IGBT is a device having functions of an IGBT and a diode within one chip.

An emitter terminal ET is connected to an emitter of each of the transistors T1 to T4, and an emitter current can thereby be monitored.

Figure 2:
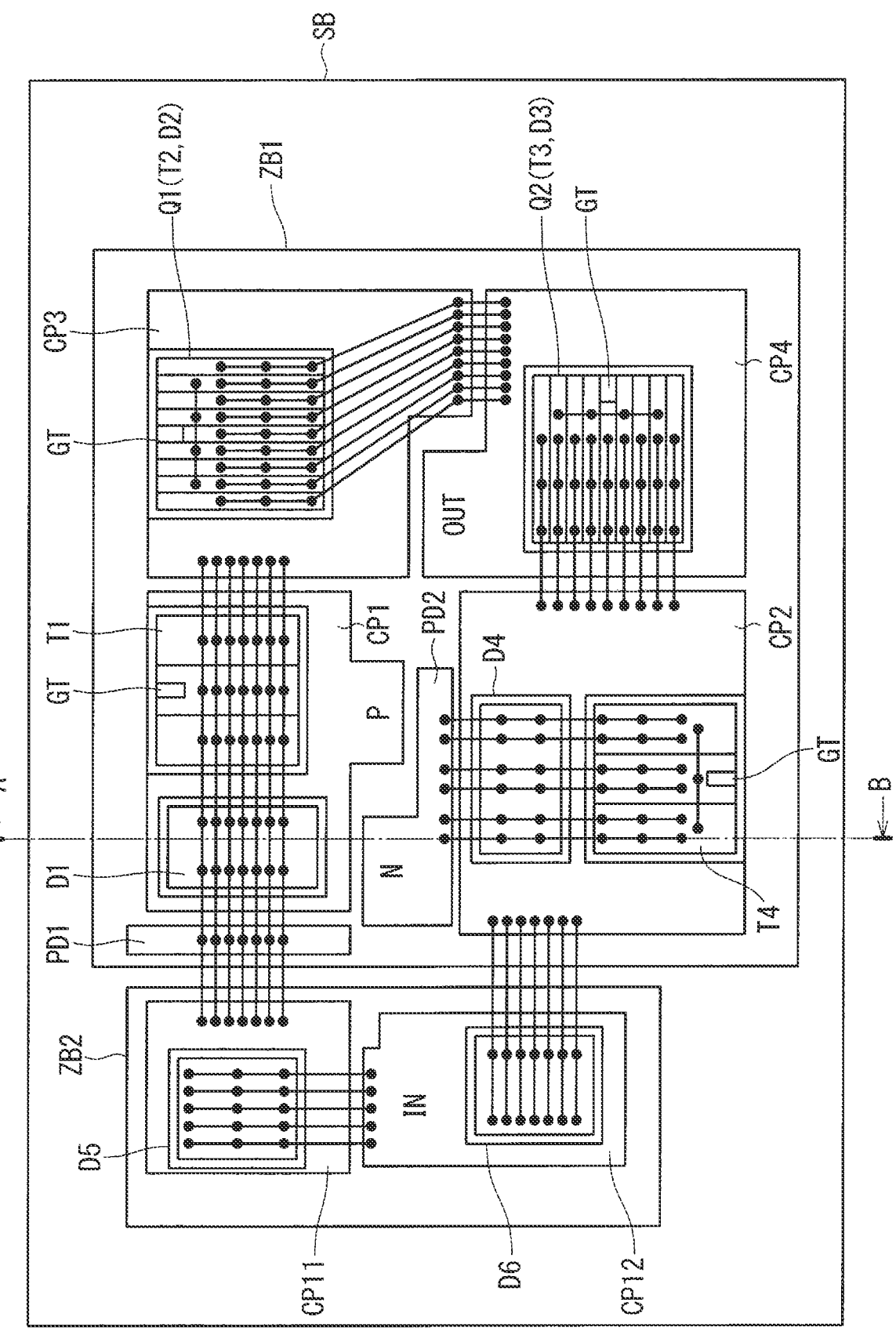
FIG. 2 is a diagram showing a plan layout of a semiconductor module in which the half-bridge circuit of the three-level I-type inverter according to the first preferred embodiment of the present invention is housed.
Figure 3:
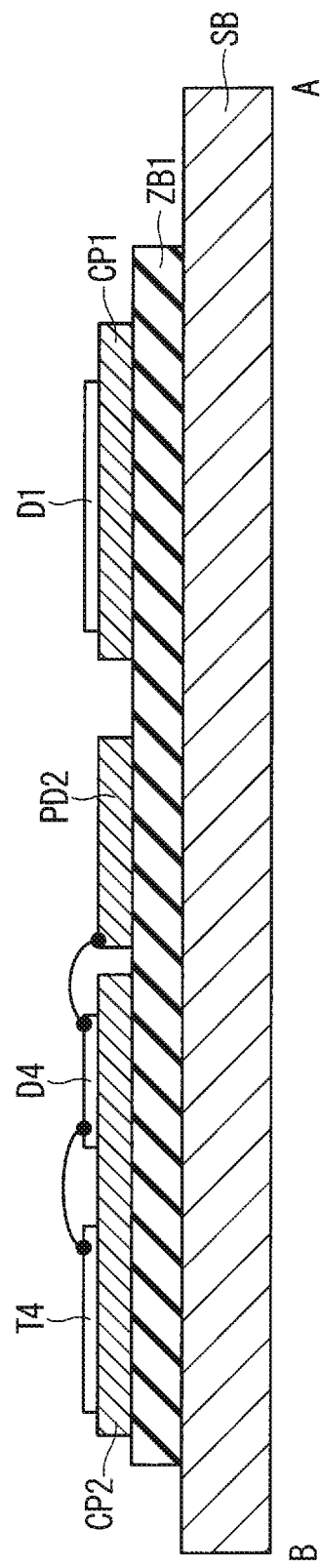
FIG. 3 is a cross-sectional view of the semiconductor module in which the half-bridge circuit of the three-level I-type inverter according to the first preferred embodiment of the present invention is housed.
Figure 4:
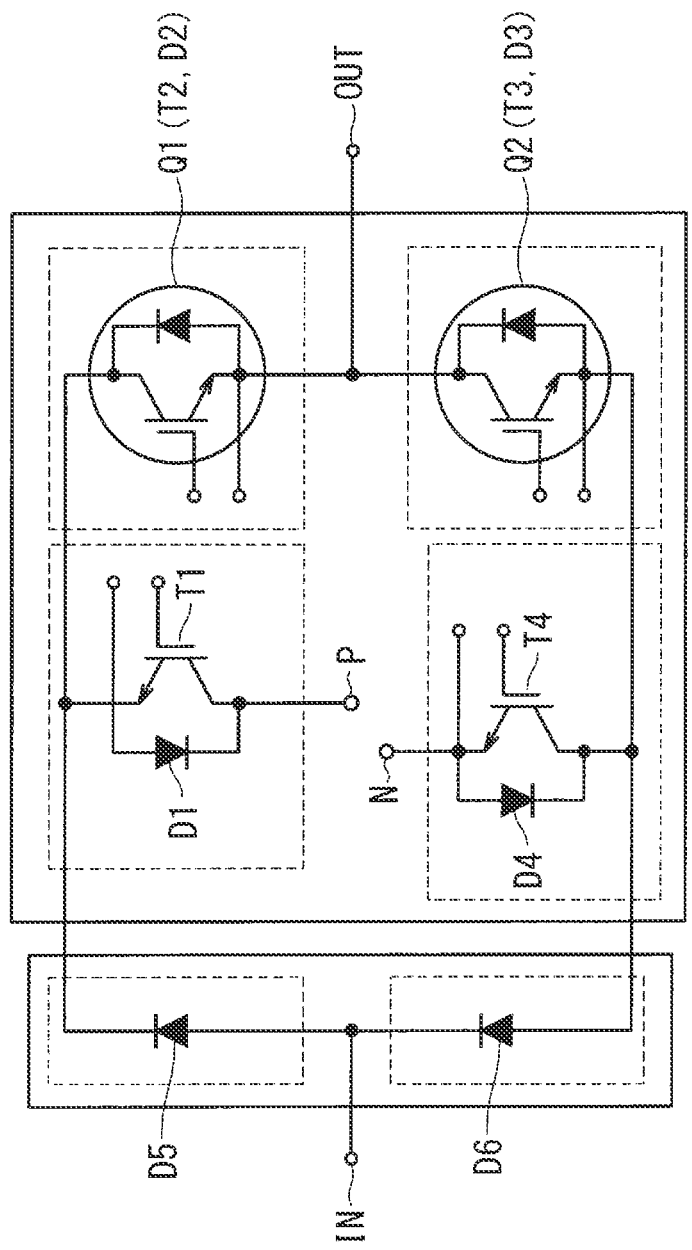
FIG. 4 is a circuit diagram illustrated correspondingly to the plan layout of the half-bridge circuit of the three-level I-type inverter according to the first preferred embodiment of the present invention.

FIG. 2 is a diagram showing a plan layout of a semiconductor module in which the half-bridge circuit 90 of the three-level I-type inverter shown in FIG. 1 is housed in one package. FIG. 2 shows a state without the package etc. Further, FIG. 3 is a cross-sectional view taken along the line A-B of FIG. 2 as seen in the direction of the arrows. Further, FIG. 4 is a circuit diagram illustrated correspondingly to the plan layout of the half-bridge circuit 90 shown in FIG. 2.

As shown in FIG. 2 and FIG. 3, the half-bridge circuit 90 is disposed on insulating substrates ZB1 and ZB2 that are provided on a base plate SB such as a metal plate. More specifically, rectangular conductive patterns CP11 and CP12 are provided separately from each other on the longitudinal insulating substrate ZB2 that is located on the left side of the rectangular base plate SB in plan view. The diodes D5 and D6 are respectively disposed on the conductive patterns CP11 and CP12.

The insulating substrate ZB1 having a rectangular shape is provided approximately at a central portion of the base plate SB. In a left area of the insulating substrate ZB1 in plan view, rectangular conductive patterns CP1 and CP2 are provided to be adjacently arranged front and behind in plan view. Further, a rectangular conductive pattern CP3 is provided on the adjacent right side of the conductive pattern CP1 in plan view. A rectangular conductive pattern CP4 is provided on the adjacent right side of the conductive pattern CP2 in plan view. Note that, the conductive patterns CP1 to CP4 are provided separately from each other.

The diode D1 is disposed in a left area of the conductive pattern CP1 in plan view, and the transistor T1 is disposed on the adjacent right side of the diode D1. The diode D4 is disposed in an upper area of the conductive pattern CP2 in plan view, and the transistor T4 is disposed on the adjacent lower side of the diode D4.

In each of the diodes D1, D4, D5, and Db, an anode is provided on a front surface, and a cathode is provided on a back surface. In each of the transistors T1 and T4, an emitter is provided on a front surface, and a drain is provided on a back surface. Further, in each of the transistors Q1 and Q2, an emitter of the respective transistors T2 and T3 is provided on a front surface, and a drain thereof is provided on a back surface. Further, in each of the transistors Q1 and Q2, an anode of the respective diodes D2 and D3 is provided on a front surface, and a cathode thereof is provided on a back surface.

The transistor Q1 is disposed in the conductive pattern CP3, and the transistor Q2 is disposed in the conductive pattern CP4.

Further, in an upper area of the conductive pattern CP12 in plan view, a pad (hereinafter referred to as a pad IN) is provided, which is electrically connected to the input node IN. The pad IN also serves as a bonding pad to be wire-bonded to an anode of the diode D5.

On the adjacent left side of the conductive pattern CP1, a bonding pad PD1 is provided, which is separated and electrically isolated from the conductive pattern CP1. The conductive pattern CP11 is electrically connected to an anode of the diode D1 via the bonding pad PD1 with wire bonding. Further, the anode of the diode D1 is electrically connected to an emitter of the transistor T1 with wire bonding.

In a lower area of the conductive pattern CP1 in plan view, a pad (hereinafter referred to as a pad P) is provided, which projects toward the conductive pattern CP2 side and is electrically connected to the main power-supply node P. Further, the conductive pattern CP1 is electrically connected to the conductive pattern CP3 with wire bonding.

On the adjacent upper side of the conductive pattern CP2, a pad (hereinafter referred to as a pad N) is provided, which is separated and electrically isolated from the conductive pattern CP2 and is electrically connected to the main power-supply node N. The pad N partially projects toward the conductive pattern CP2 side, and the projecting portion is electrically connected to the main power-supply node N. The pad N also serves as a bonding pad to be wire-bonded to an anode of the diode D4. Further, the anode of the diode D4 is electrically connected to an emitter of the transistor T4 with wire bonding.

The conductive pattern CP2 is electrically connected to an anode of the diode D6 with wire bonding, and is also electrically connected to an emitter of the transistor T3 and an anode of the diode D3 of the transistor Q2 with wire bonding.

A lower area of the conductive pattern CP3 in plan view is formed into a projecting portion that projects toward the conductive pattern CP4 side. An emitter of the transistor T2 and an anode of the diode D2 of the transistor Q1 are electrically connected to the projecting portion with wire bonding, and are electrically connected to the conductive pattern CP4 with wire bonding.

In an upper area of the conductive pattern CP4 in plan view, a pad (hereinafter referred to as a pad OUT) is provided, which projects toward the conductive pattern CP3 side and is electrically connected to the output node OUT.

In this manner, in the plan layout of the semiconductor module in which the half-bridge circuit 90 of the three-level I-type inverter is housed in one package, the transistors and the diodes are disposed such that the pad IN, the pad N, the pad P, and the pad OUT are aligned roughly in a line at the center of the package. This configuration allows the main power-supply nodes, the input node, and the output node to be more easily connected with an external wire, when a two-phase three-level I-type inverter and a three-phase three-level I-type inverter are formed by using a plurality of semiconductor modules each including one half-bridge circuit 90.

Note that, the pad IN, the pad OUT, the pad N, and the pad P are respectively electrically connected to an input terminal, an output terminal, and main power-supply terminals that are exposed on a surface of a resin case (not shown) through an internal wire (not shown). Further, a gate pad GT is provided on each surface of the transistors T1 and T4, the transistor T2 of the transistor Q1, and the transistor T3 of the transistor Q2. Each gate pad GT is provided on a side opposite to the side where the pad IN, the pad OUT, the pad N, and the pad P are provided, i.e., each gate pad GT is provided on an outer edge side of the package, and is connected with wire bonding to a terminal board (not shown) provided on a side portion of the package.

Further, although not shown in FIG. 2, emitter terminals ET of the transistors shown in FIG. 1 are provided in the anodes of the diodes D1 and D4 and the anodes of the diodes D2 and D3 of the transistors Q1 and Q2, respectively. Similarly to the gate pads GT, the emitter terminals ET are connected with wire bonding to a terminal board (not shown) provided on a side portion of the package.

Further, the transistors Q1 and Q2 each being an RC-IGBT are disposed to have a positional relationship in which one of them is rotated by 90° with respect to the other. This configuration is employed for the following reason. That is, since the RC-IGBT has a structure in which an IGBT and a diode are alternately arranged, such a configuration in which a bonding position is provided along an extending direction of an emitter and a cathode serves to avoid crossing of bonding wires, facilitate wire bonding, and suppress increase of the areas of the conductive patterns CP3 and CP4, during wire bonding.

Further, as compared to a case of arranging the transistor T4 and the diode D4 side by side in plan view, arranging the transistor T4 and the diode D4 front and behind in plan view can reduce the length of the conductive pattern CP12, and can thereby reduce the length of the insulating substrate ZB2 as well.

<Operation>

Incidentally, since an IGBT and a diode are formed in one chip in the transistors Q1 and Q2 each being an RC-IGBT, the total area of each of the transistors Q1 and Q2 can be reduced as compared to a case of providing an IGBT and a diode in separate chips. That is, although the RC-IGBT has a chip area larger than that of an individual IGBT in plan view, the chip area of the RC-IGBT is ultimately smaller than the total chip area of an individual IGBT and an individual diode. For this reason, the usage of RC-IGBTs as the transistors Q1 and Q2 can reduce the entire area of the semiconductor module.

As described above, it is possible to reduce the entire area of the semiconductor module by using RC-IGBTs as the transistors Q1 and Q2. Before arriving at the technical idea of using RC-IGBTs as the transistors Q1 and Q2, however, operation of the three-level I-type inverter as described below needed to be investigated.

That is, an RC-IGBT is known to have a tendency to generate larger switching losses than an individual IGBT. Therefore, as disclosed in Japanese Patent Application Laid-Open No. 2003-70262, the usage of RC-IGBTs as all of the transistors forming a three-level I-type inverter may raise a problem of increasing switching losses, in spite of the reduction of the area occupied by a chip.

Now, operation of a three-level I-type inverter is described with an example of a two-phase three-level I-type inverter.

FIG. 5 to FIG. 8 are each a circuit diagram for illustrating operation of a two-phase three-level I-type inverter. FIG. 5 to FIG. 8 show the same circuit configuration. First, the circuit configuration is described with reference to FIG. 5.

Figure 5:
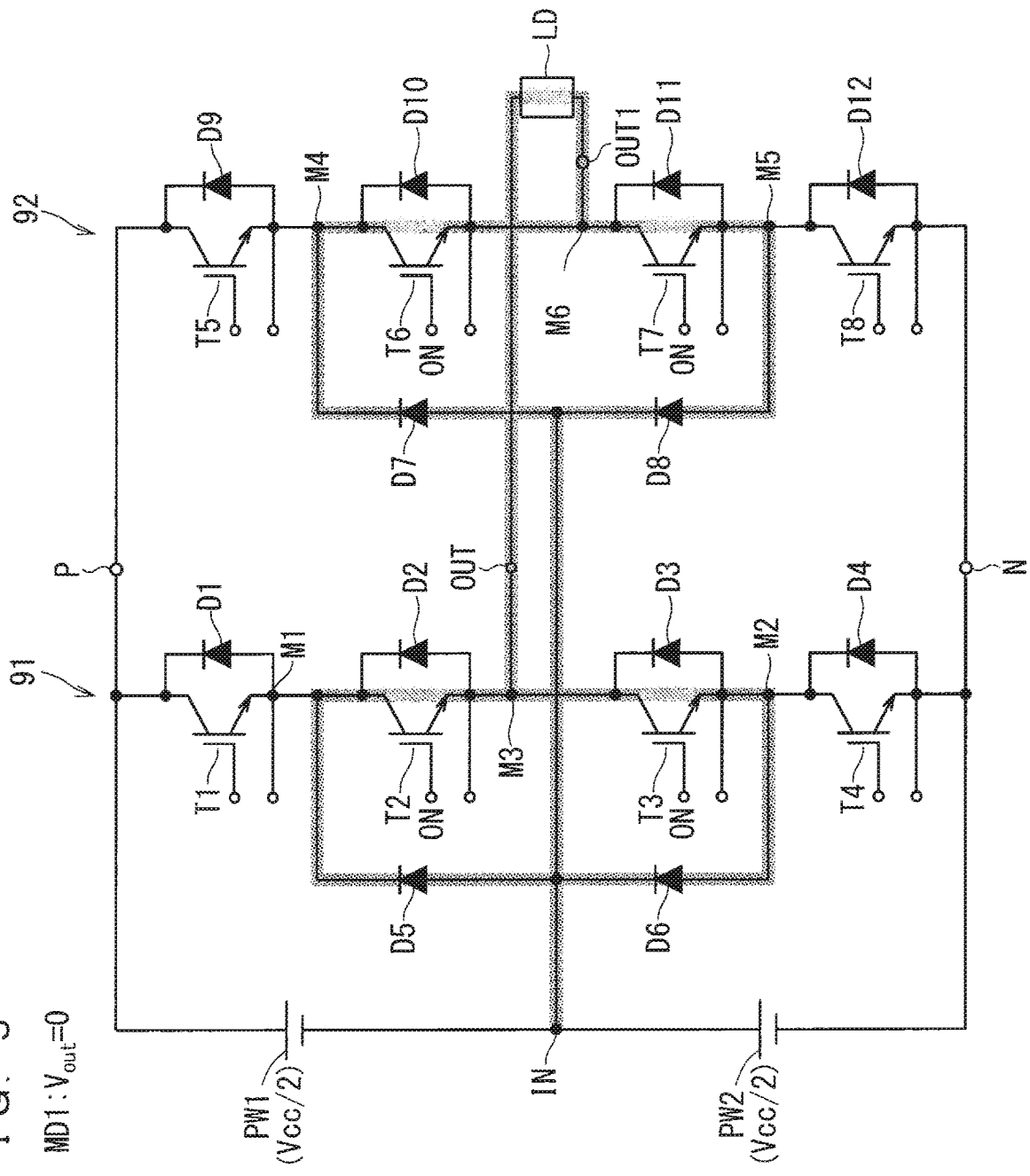
FIG. 5 to FIG. 12 are circuit diagrams for illustrating operation of a two-phase three-level I-type inverter.

As shown in FIG. 5, a two-phase three-level I-type inverter includes half-bridge circuits 91 and 92, to which electric power is supplied by power supplies PW1 and PW2 connected in series. Note that, the power supply PW1 is a power supply of Vcc/2 with respect to an input node IN, and the power supply PW2 is a power supply of Vcc/2 with respect to a main power-supply node N.

In the half-bridge circuit 91, transistors T1, T2, T3, and T4 are connected in series in the mentioned order from a high potential side between the main power-supply node P having high potential and the main power-supply node N having low potential.

The transistors T1 to T4 are IGBTs. A collector of the transistor T1 is connected to the main power-supply node P, an emitter thereof is connected to a collector of the transistor T2. An emitter of the transistor T2 is connected to a collector of the transistor T3. An emitter of the transistor T3 is connected to a collector of the transistor T4. An emitter of the transistor T4 is connected to the main power-supply node N.

Between a connection node M1 of the transistor T1 and the transistor T2 and a connection node M2 of the transistor T3 and the transistor T4, diodes D5 and 06 are connected in anti-parallel with the series connection of the transistors T2 and T3. Note that, the diodes D5 and D6 serve as clamp diodes.

A connection node of the diodes D5 and D6 is connected to an input node IN, which serves as a connection node of the power supply PW1 and the power supply PW2. Further, a connection node M3 of the transistor T2 and the transistor T3 is connected to an output node OUT of the half-bridge circuit 91.

Diodes D1 to D4 are respectively connected to the transistors T1 to T4 in anti-parallel.

Further, in the half-bridge circuit 92, transistors T5, T6, T7, and T8 are connected in series in the mentioned order from a high potential side between the main power-supply node P and the main power-supply node N.

The transistors T5 to T8 are IGBTs. A collector of the transistor T5 is connected to the main power-supply node P, an emitter thereof is connected to a collector of the transistor T6. An emitter of the transistor T6 is connected to a collector of the transistor T7. An emitter of the transistor T7 is connected to a collector of the transistor T8. An emitter of the transistor T8 is connected to the main power-supply node N.

Between a connection node M4 of the transistor T5 and the transistor T6 and a connection node M5 of the transistor T7 and the transistor T8, diodes D7 and D8 are connected in anti-parallel with the series connection of the transistors T6 and T7. Note that, the diodes D7 and D8 serve as clamp diodes.

A connection node of the diodes D7 and D8 is connected to the input node IN serving as a connection node of the power supply PW1 and the power supply PW2. Further, a connection node M6 of the transistor T6 and the transistor T7 is connected to an output node OUT1 of the half-bridge circuit 92.

Diodes D9 to D12 are respectively connected to the transistors T5 to T8 in anti-parallel.

Further, an inductive load LD is connected between the output node OUT of the half-bridge circuit 91 and the output node OUT1 of the half-bridge circuit 92.

Switching operation of such a two-phase three-level I-type inverter is described with reference to FIG. 5 to FIG. 12 and a timing chart shown in FIG. 13. FIG. 5 to FIG. 12 schematically show an ON or OFF state of each transistor in switching modes MD1 to MD8, respectively. FIG. 13 shows a timing chart of ON and OFF in each of the switching modes MD1 to MD8, and a voltage value of a voltage Vout applied to the load LD.

The switching mode MD1 shown in FIG. 5 is a mode in which the voltage Vout applied to the load LD is 0. The transistors T2, T3, T6, and T7 are all turned on, whereas the transistors T1, T4, T5, and T8 are all turned off. Therefore, a current scarcely flows through the transistors T2 and T3. Note that, the hatched lines in FIG. 5 represent devices and wiring relating to the switching mode MD1.

Figure 6:
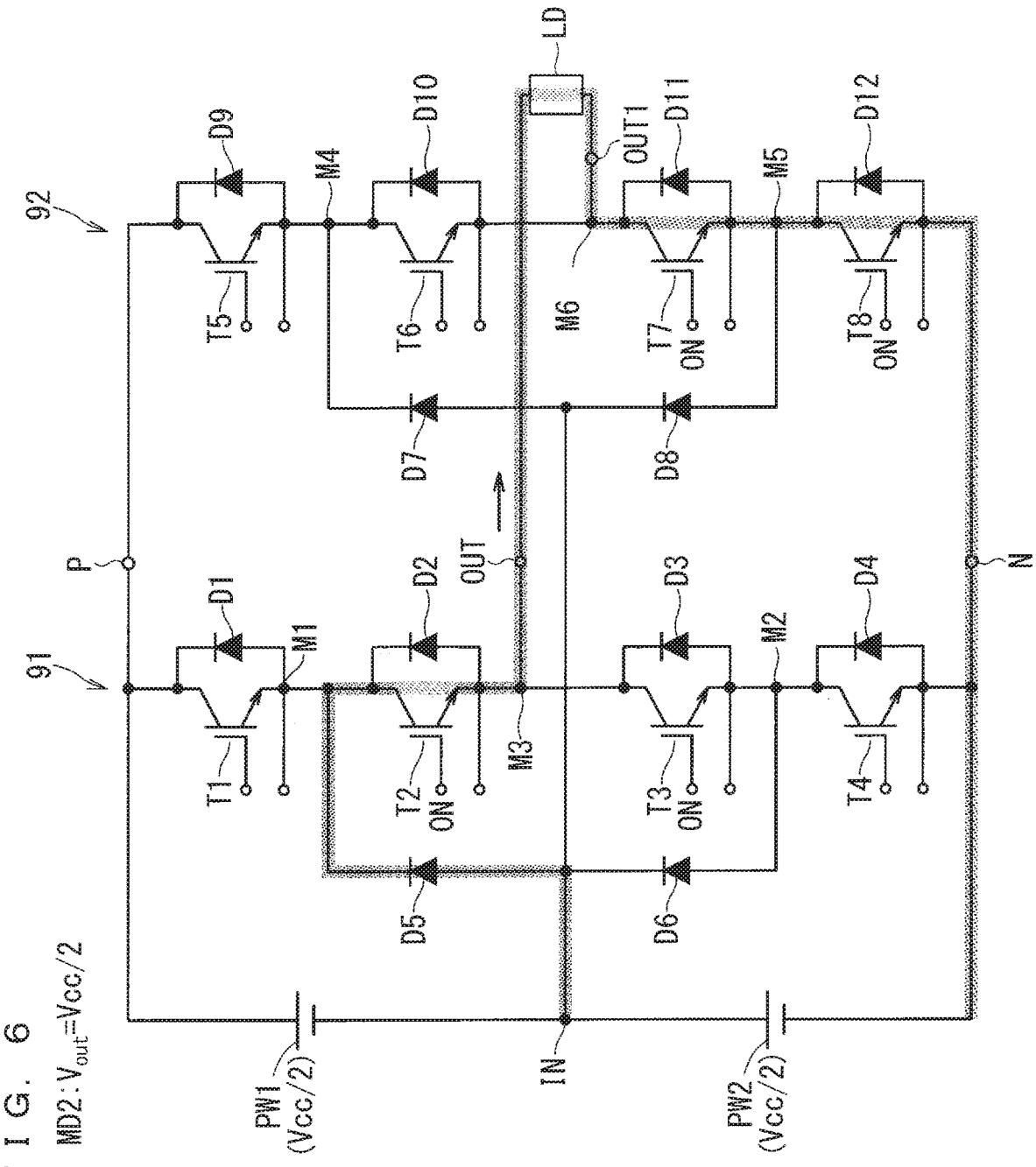

The switching mode MD2 shown in FIG. 6 is a mode in which the voltage Vout applied to the load LD is Vcc/2. Turning on the transistor T8, a current flows through the diode D5, the transistor T2, the load LD, and the transistors T7 and T8. Note that, the hatched lines in FIG. 6 represent devices and wiring relating to the switching mode MD2.

Figure 7:
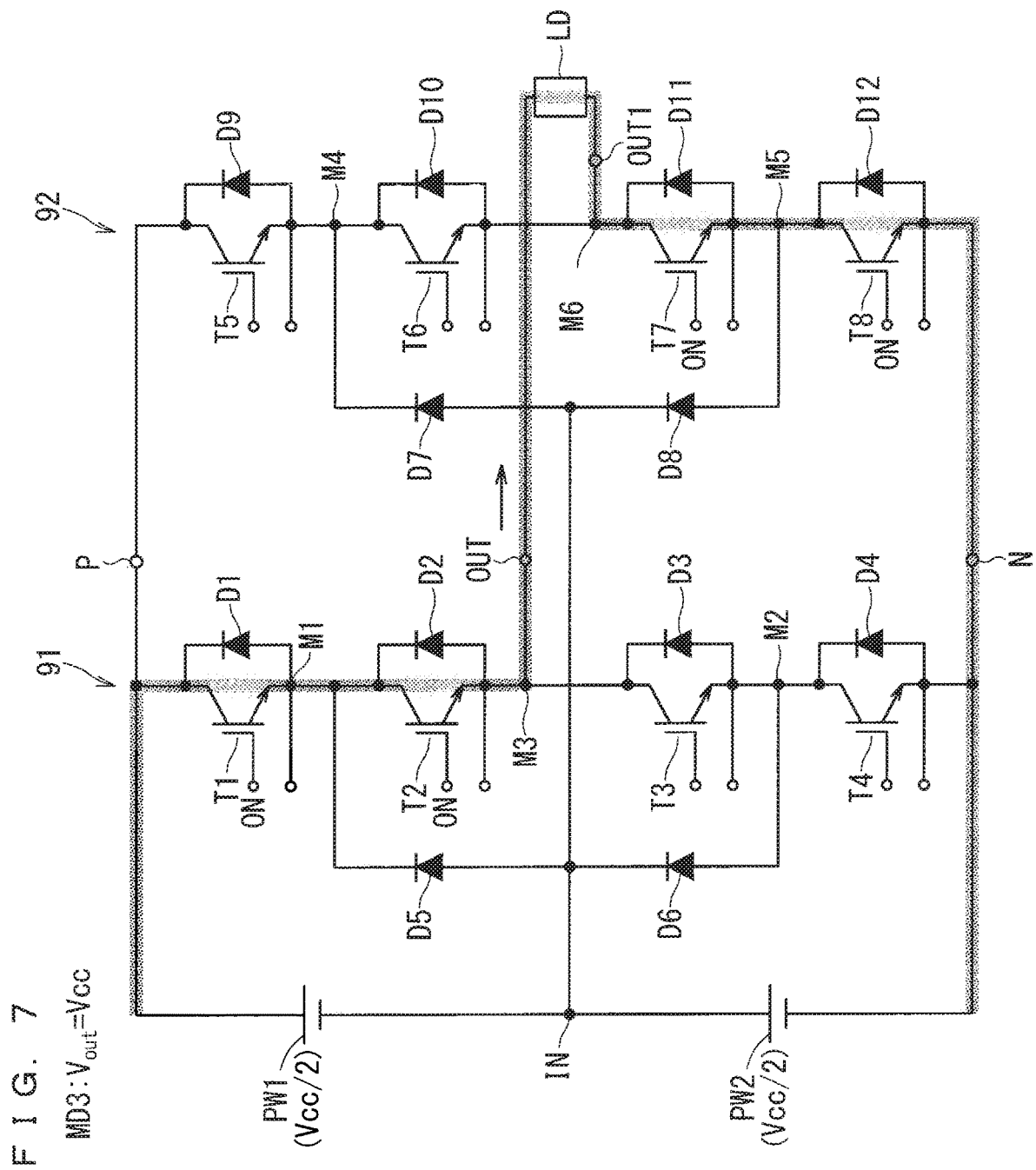

The switching mode MD3 shown in FIG. 7 is a mode in which the voltage Vout applied to the load LD is Vcc. Turning on the transistor T1, a current flows through the transistor T1, the transistor T2, the load LD, and the transistors T7 and T8. Note that, the hatched lines in FIG. 7 represent devices and wiring relating to the switching mode MD3.

Figure 8:
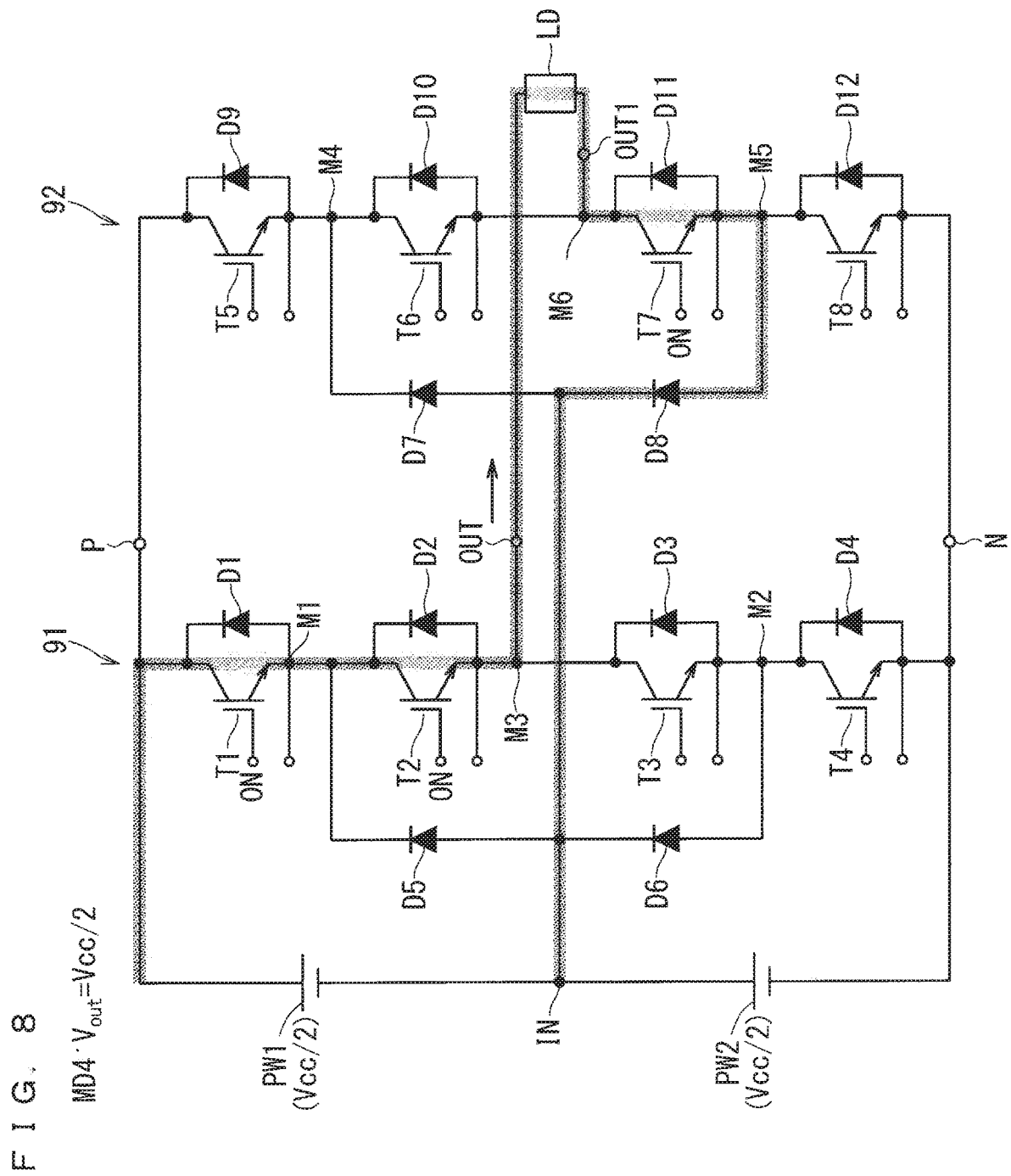

The switching mode MD4 shown in FIG. 8 is a mode in which the voltage Vout applied to the load LD is Vcc/2. Turning off the transistor T8, a current flows through the transistor T1, the transistor T2, the load LD, the transistor T7, and the diode D8. Note that, the hatched lines in FIG. 8 represent devices and wiring relating to the switching mode MD4.

Figure 9:
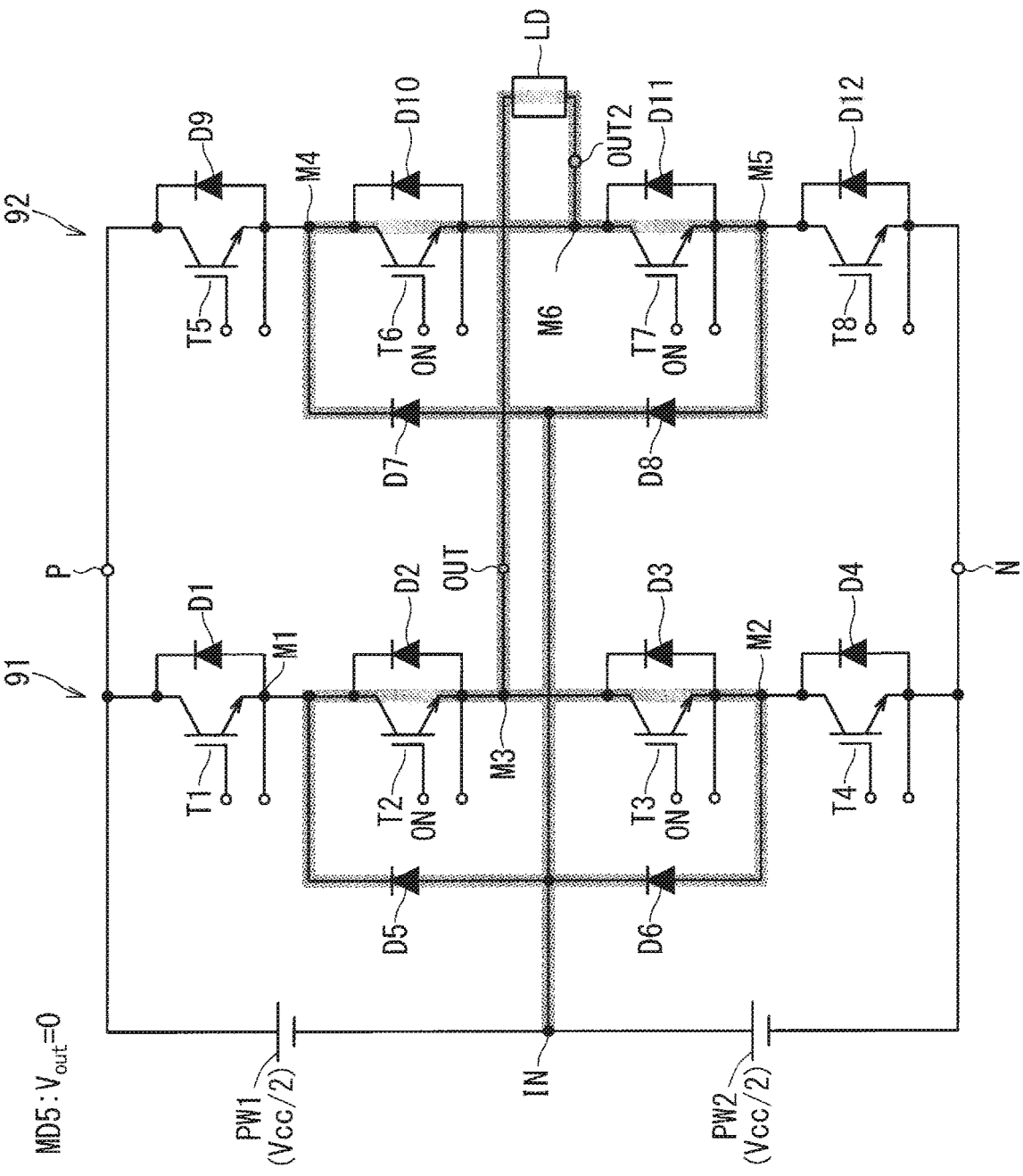

The switching mode MD5 shown in FIG. 9 is a mode in which the voltage Vout applied to the load LD is 0. The transistors T2, T3, T6, and T7 are all turned on, whereas the transistors T1, T4, T5, and T8 are all turned off. Therefore, a current scarcely flows through the transistors T2 and T3. Note that, the hatched lines in FIG. 9 represent devices and wiring relating to the switching mode MD5.

Figure 10:
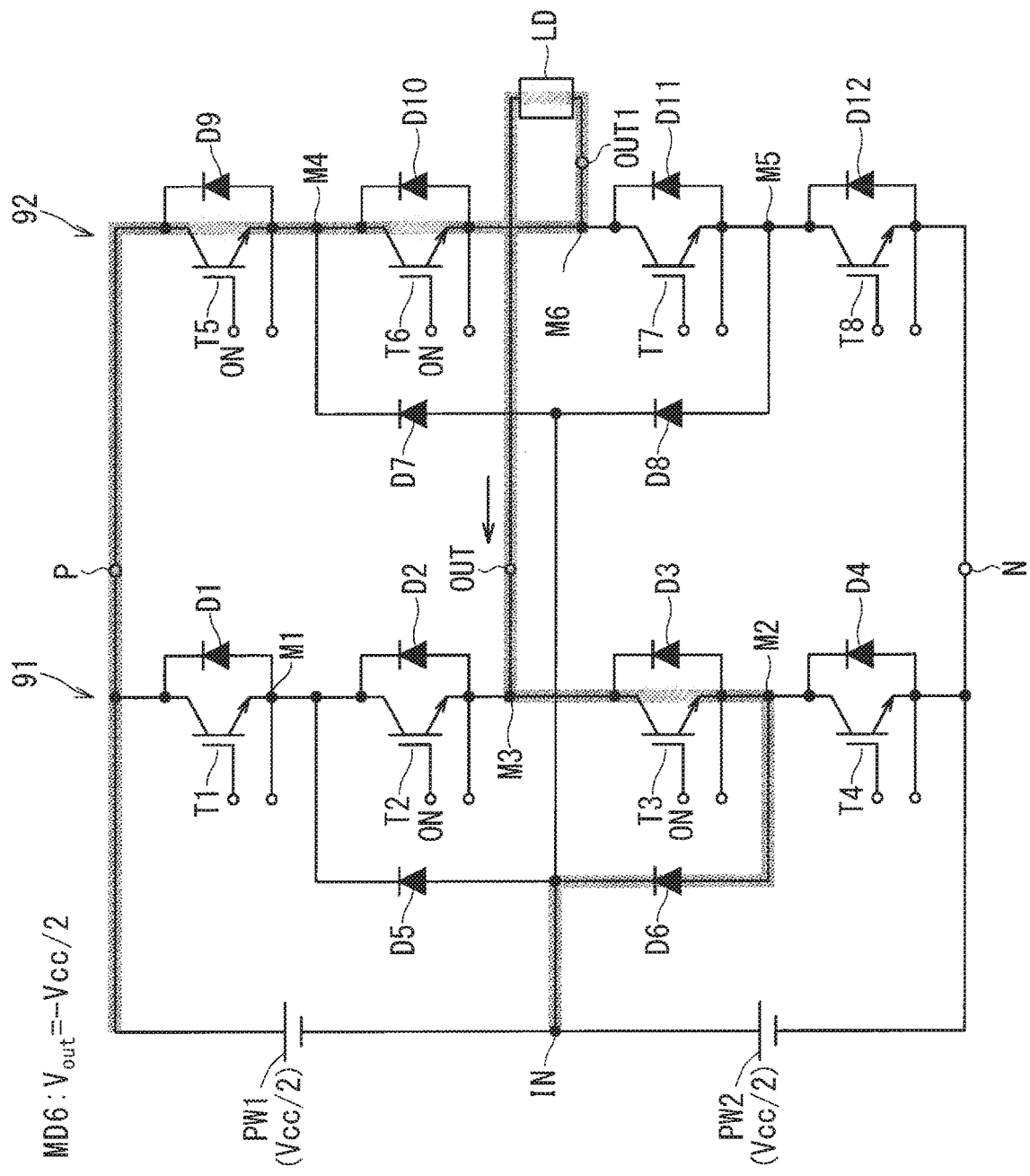

The switching mode MD6 shown in FIG. 10 is a mode in which the voltage Vout applied to the load LD is -Vcc/2. Turning on the transistor T5, a current flows through the transistor T5, the transistor T6, the load LD, the transistor T3, and the diode D6. Note that, the hatched lines in FIG. 10 represent devices and wiring relating to the switching mode MD6.

Figure 11:
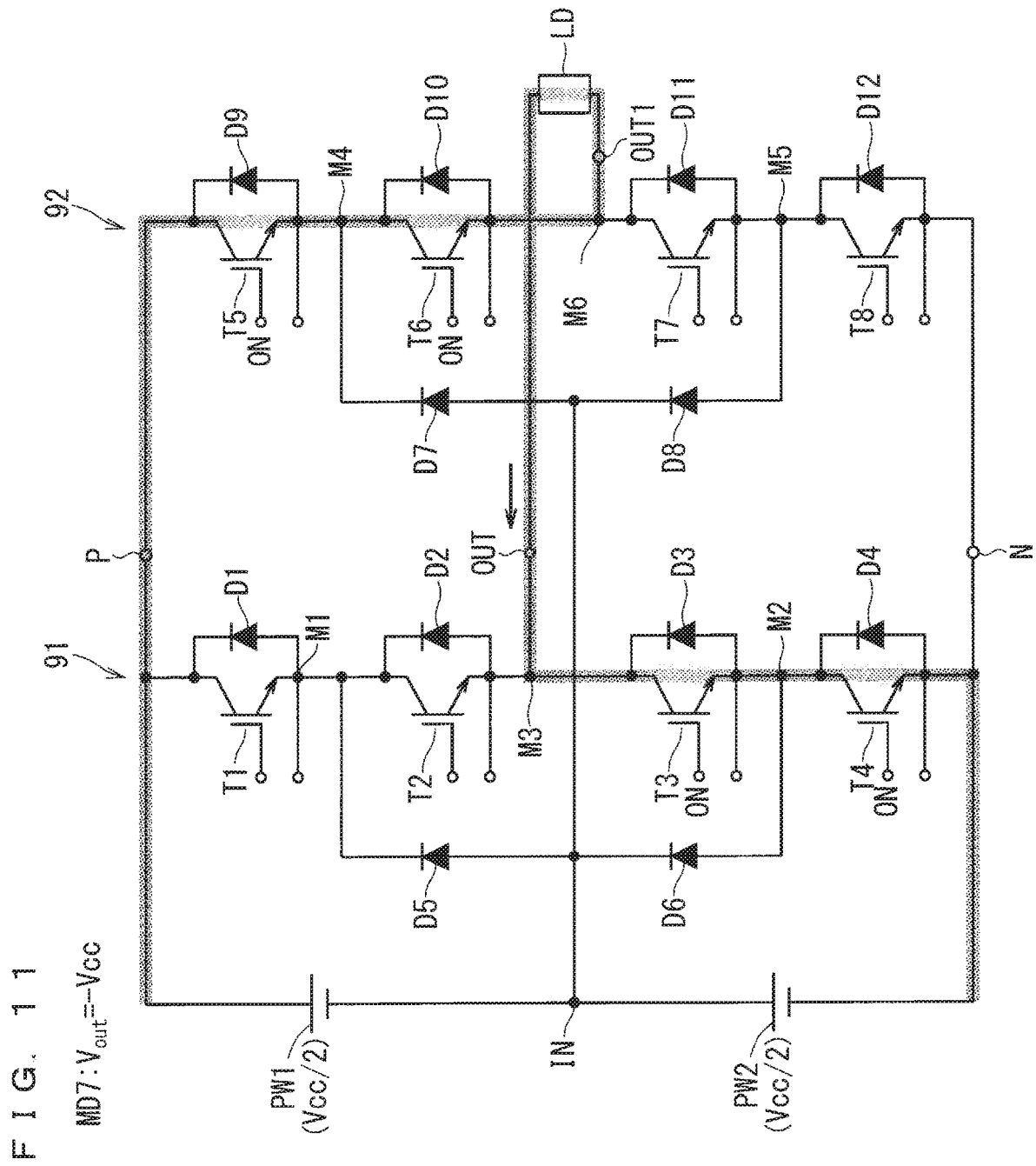

The switching mode MD7 shown in FIG. 11 is a mode in which the voltage Vout applied to the load LD is -Vcc. Turning on the transistor T4, a current flows through the transistor T5, the transistor T6, the load LD, and the transistors T3 and T4. Note that, the hatched lines in FIG. 11 represent devices and wiring relating to the switching mode MD7.

Figure 12:
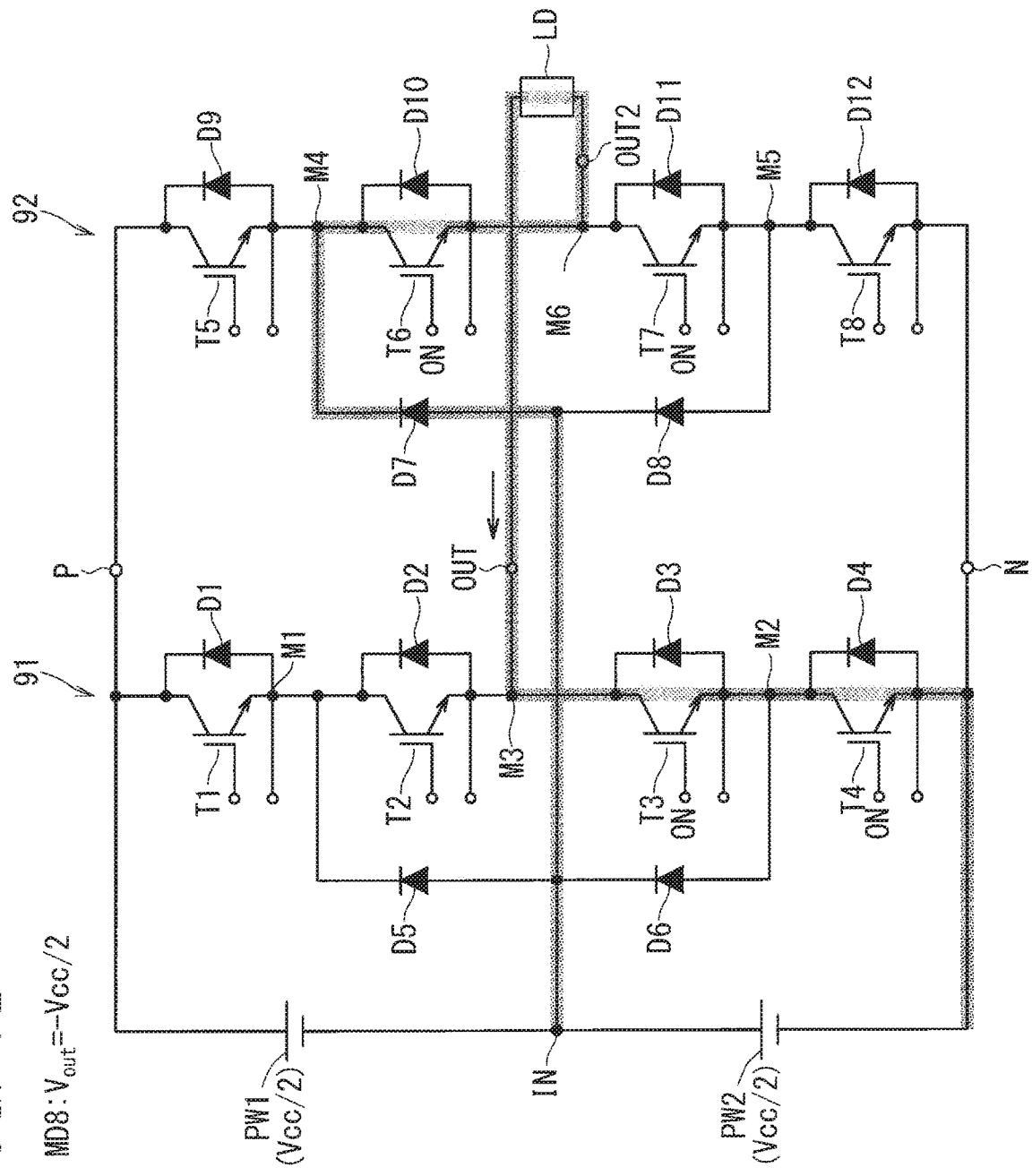
Figure 13:
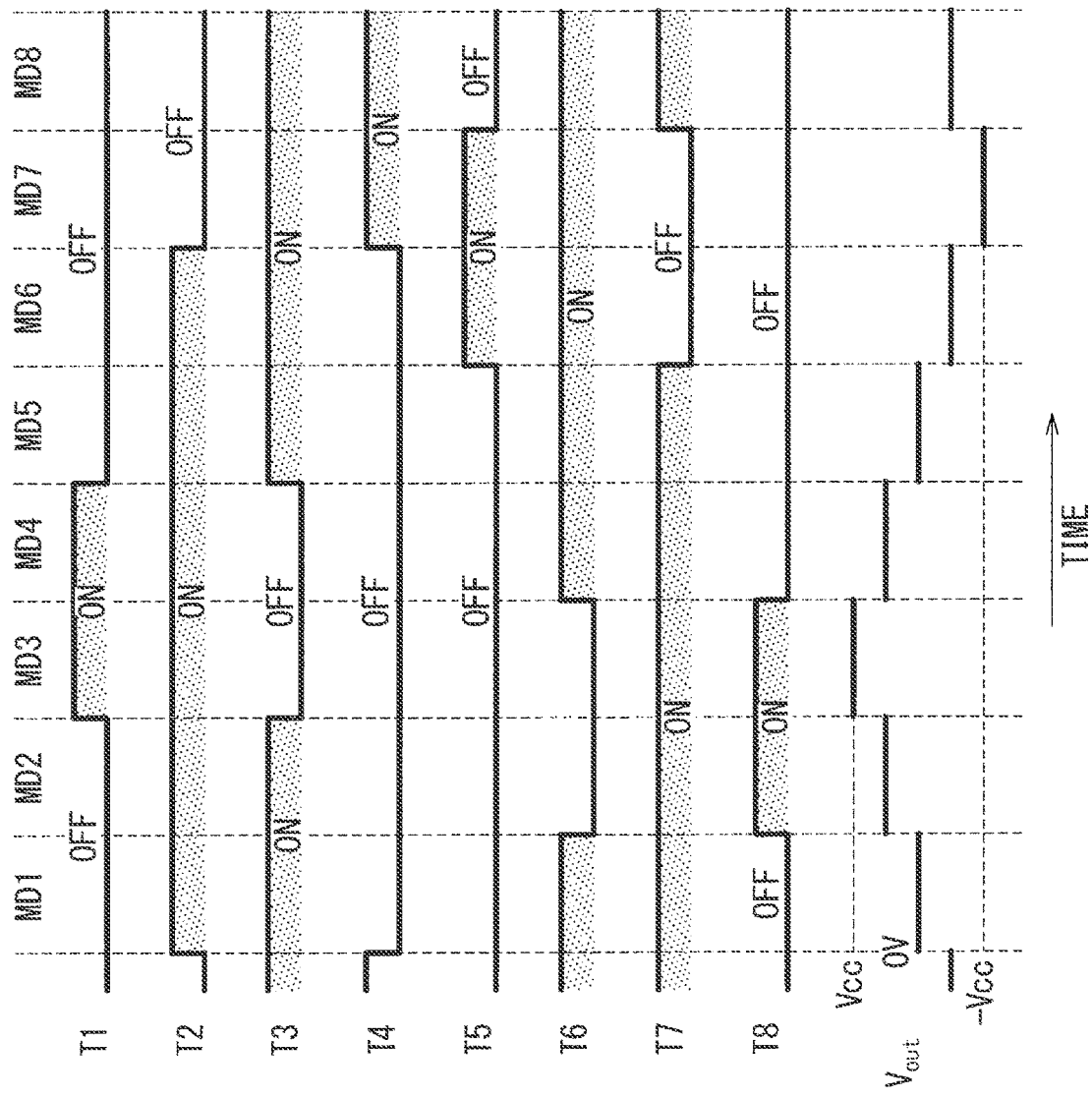
FIG. 13 is a timing chart for illustrating operation of the two-phase three-level 1-type inverter.

The switching mode MD8 shown in FIG. 12 is a mode in which the voltage Vout applied to the load LD is -Vcc/2. Turning off the transistor T5, a current flows through the diode D7, the transistor T6, the load LD, and the transistors T3 and T4. Note that, the hatched lines in FIG. 12 represent devices and wiring relating to the switching mode MD8.

Incidentally, the timing at which the transistor T2 is turned on is when the mode is changed from the switching mode MD8 to the switching mode MD1. A voltage to be applied to the load LD in the switching mode MD1 is 0 V, and a current is to scarcely flow through the transistor T2. A switching loss in a switching device is generated by an amount calculated by integrating a current and a voltage flowing at the same time. Thus, if a current flowing after a switching device, namely, the transistor T2, is turned on is scarce, the switching loss of the transistor T2 is reduced accordingly.

Similarly, the timing at which the transistor T3 is turned on is when the mode is changed from the switching mode MD4 to the switching mode MD5. A voltage to be applied to the load LD in the switching mode MD5 is 0 V, and a current is to scarcely flow through the transistor T3. A switching loss in a switching device is generated by an amount calculated by integrating a current and a voltage flowing at the same time. Thus, if a current flowing after a switching device, namely, the transistor T3, is turned on is scarce, the switching loss of the transistor T3 is reduced accordingly.

Further, the timing at which the transistor T2 is turned off is when the mode is changed from the switching mode MD6 to the switching mode MD7. Although a voltage being applied to the load LD in the switching mode MD6 is -Vcc/2, a current is scarcely flowing through the transistor T2. Since a current flowing through the transistor T2 is small, the switching loss of the transistor T2 generated by an amount calculated by integrating a current and a voltage is small even if a voltage is applied to the transistor T2 after switching-off is carried out from the state where a current scarcely flows.

Similarly, the timing at which the transistor T3 is turned off is when the mode is changed from the switching mode MD2 to the switching mode MD3. Although a voltage being applied to the load LD in the switching mode MD2 is Vcc/2, a current is scarcely flowing through the transistor T3. Since a current flowing through the transistor T3 is small, the switching loss of the transistor T3 generated by an amount calculated by integrating a current and a voltage is small even if a voltage is applied to the transistor T3 after switching-off is carried out from the state where a current scarcely flows.

In contrast, the timing at which the transistor T1 is turned on is when the mode is changed from the switching mode MD2 to the switching mode MD3. A voltage being applied to the load LD in the switching mode MD2 is Vcc/2, and an even larger load current will start flowing through the transistor T1 after the transistor T1 is turned on. Therefore, the switching loss of the transistor T1 generated by an amount calculated by integrating a current and a voltage is large.

Similarly, the timing at which the transistor T4 is turned on is when the mode is changed from the switching mode MD6 to the switching mode MD7. A voltage being applied to the load LD in the switching mode MD6 is −Vcc/2, and an even larger load current will start flowing through the transistor T4 after the transistor T4 is turned on. Therefore, the switching loss of the transistor T4 generated by an amount calculated by integrating a current and a voltage is large.

Further, the timing at which the transistor T1 is turned off is when the mode is changed from the switching mode MD4 to the switching mode MD5. A voltage being applied to the load LD in the switching mode MD4 is Vcc/2, and a load current is flowing when the transistor T1 is turned off. Therefore, the switching loss of the transistor T1 generated by an amount calculated by integrating a current and a voltage is large.

Similarly, the timing at which the transistor T4 is turned off is when the mode is changed from the switching mode MD8 to the switching mode MD1. A voltage being applied to the load LD in the switching mode MD8 is −Vcc/2, and a load current is flowing when the transistor T4 is turned off. Therefore, the switching loss of the transistor T4 generated by an amount calculated by integrating a current and a voltage is large.

In this manner, in the three-level I-type inverter, switching losses generated when the transistors T1 and T4 are turned on or off are larger than switching losses generated when the transistors T2 and T3 are turned on or off. Thus, if each of the transistors T1 and T4 is also replaced by an RC-IGBT, which is known to have larger switching losses than an individual IGBT, the switching losses are undesirably further increased.

Conversely, the inventors focused on the fact that, in the three-level I-type inverter, switching losses generated when the transistors T2 and T3 are turned on or off are smaller than switching losses generated when the transistors T1 and T4 are turned on or off as in the above description, and reached a conclusion that replacing the transistors T2 and T3 with RC-IGBTs suppresses increase in switching losses and consequently such replacement with RC-IGBTs can reduce the area occupied by a chip.

Figure 14:
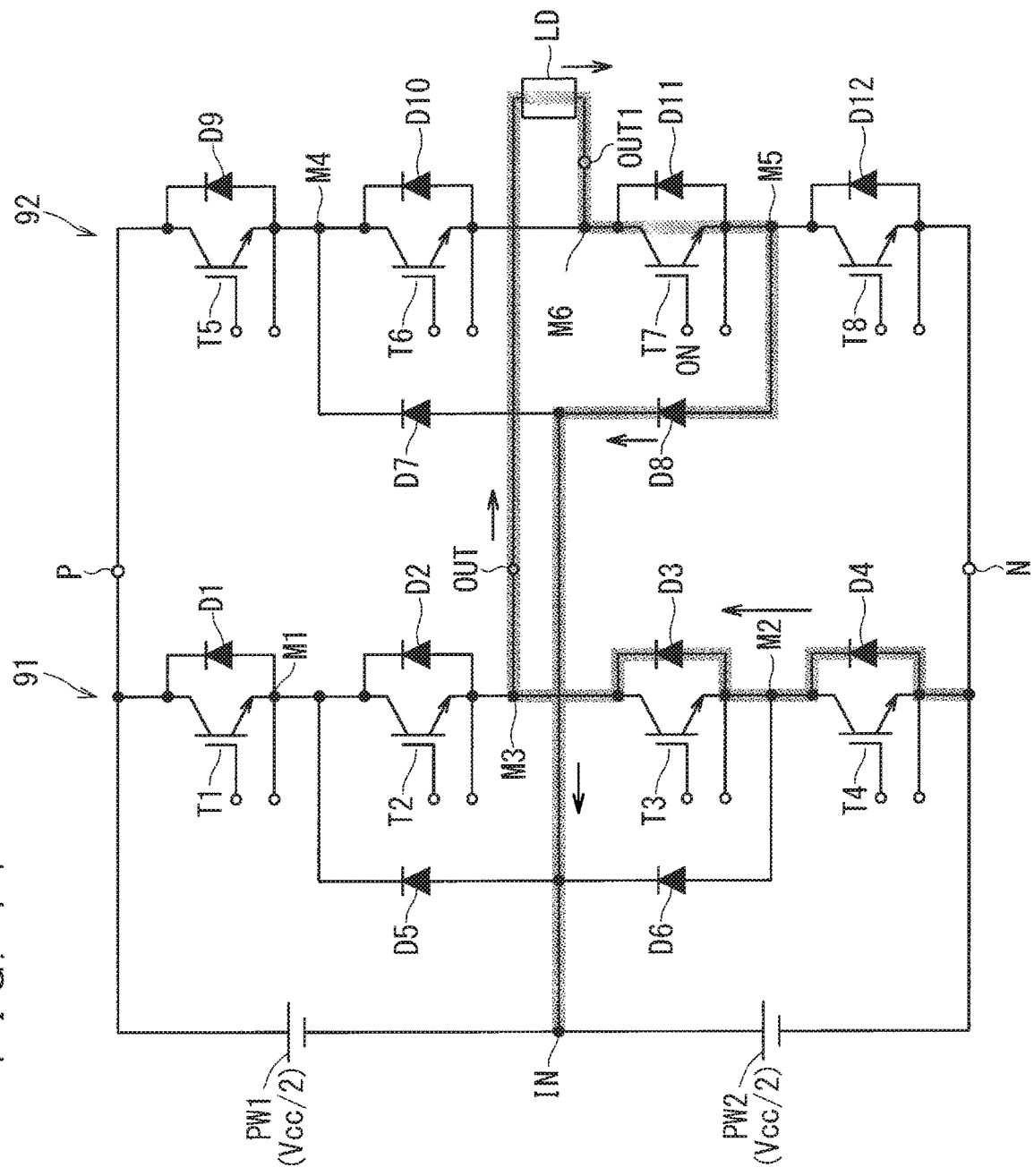
FIG. 14 is a diagram showing a current path of a case where a freewheeling current flows through a diode.

Further, as for the diodes D2 and D3, steady-state losses account for the majority of their losses, and the proportion of switching losses is small. That is, the diodes D2 and D3 are diodes serving as freewheeling diodes. When a state is changed from the state of the switching mode MD2 shown in FIG. 6 to the state of the switching mode MD1 shown in FIG. 5, a freewheeling current flows through the diode D3. FIG. 14 shows a current path of such a case.

As shown in FIG. 14, a freewheeling current flows through the diodes D4 and D3, the load LD, the transistor T7, and the diode D8, to enter the input node IN. When a state is changed from the state where a current flows through the diode D3 to the state of the switching mode MD1 shown in FIG. 5 where a current no longer flows through the diode D3, a recovery current generated after the current flows through the diode D3 does not flow through the diode D3 but does flow through the transistor T3 because the transistor T3 is turned on. Therefore, recovery losses, i.e., switching losses, are scarcely generated in the diode D3.

Figure 15:
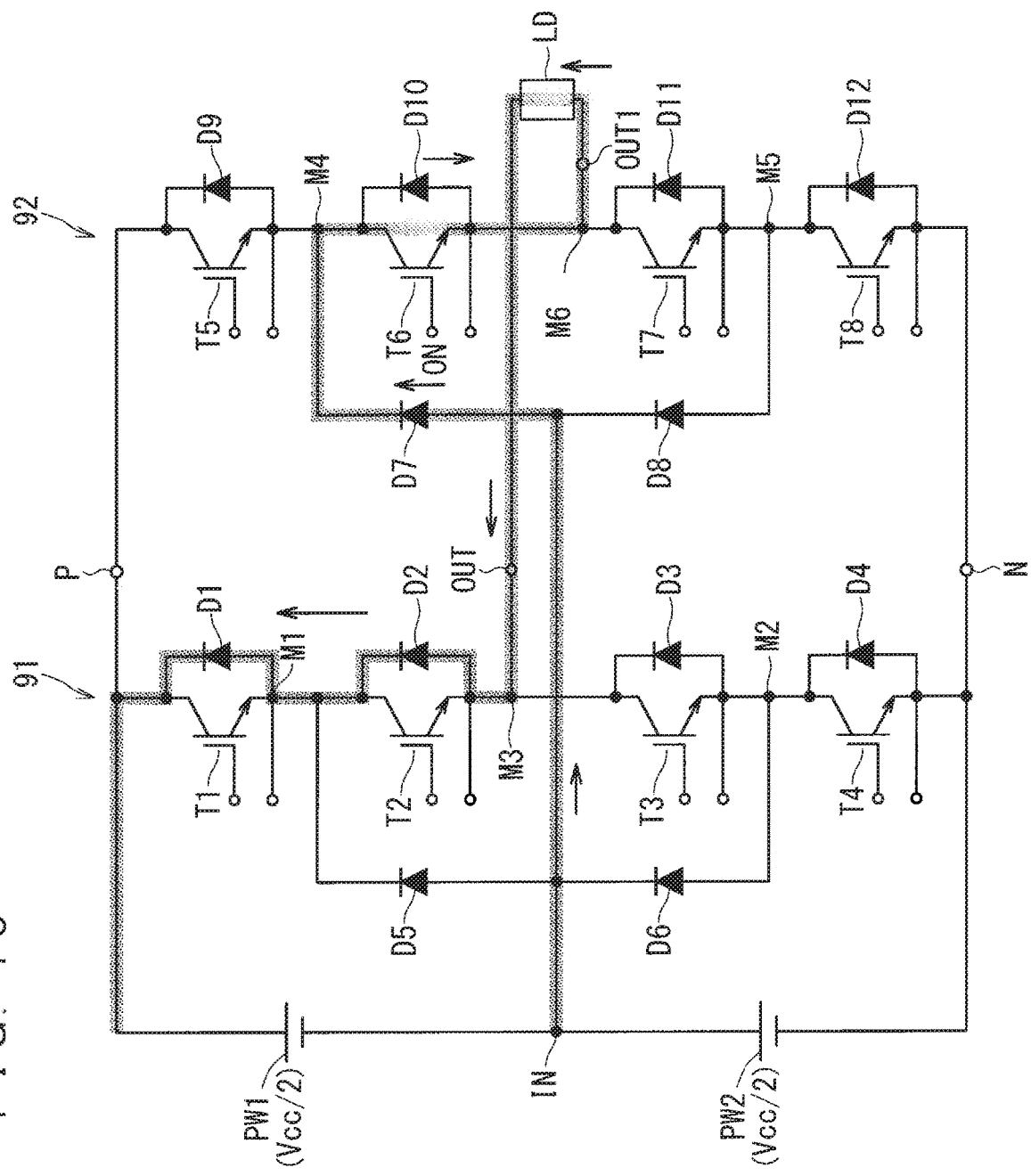
FIG. 15 is a diagram showing a current path of a case where a freewheeling current flows through a diode.

The same applies in the diode D2. When a state is changed from the state of the switching mode MD6 shown in FIG. 10 to the state of the switching mode MD5 shown in FIG. 9, a freewheeling current flows through the diode D2. FIG. 15 shows a current path of such a case.

As shown in FIG. 15, a freewheeling current flows from the input node IN, through the diode D7, the transistor T6, the load LD, and the diodes D2 and D1, to enter the power supply PW1. When a state is changed from the state where a current flows through the diode D2 to the state of the switching mode MD5 shown in FIG. 9 where a current no longer flows through the diode D2, a recovery current generated after the current flows through the diode D2 does not flow through the diode D2 but does flow through the transistor T2 because the transistor T2 is turned on. Therefore, recovery losses, i.e., switching losses, are scarcely generated in the diode D2.

The inventors focused on the fact that, as for the diodes D2 and D3, steady-state losses account for the majority of their losses and the proportion of switching losses is small as in the above description, and reached a conclusion that replacing the diodes D2 and D3 with RC-IGBTs suppresses increase in switching losses and consequently such replacement with RC-IGBTs can reduce the area occupied by a chip.

Through the investigation on the operation of a three-level I-type inverter as described above, the inventors arrived at the technical idea of using RC-IGBTs to form the transistor T2 and the diode D2, and the transistor T3 and the diode D3.

Incidentally, as in the above description, although the RC-IGBT has a chip area larger than that of an individual IGBT in plan view, the chip area of the RC-IGBT is ultimately smaller than the total chip area of an individual IGBT and an individual diode. For this reason, the usage of RC-IGBTs as the transistors Q1 and Q2 can reduce the entire area of the semiconductor module. Further, the area of an active region of a transistor in the RC-IGBT depends on the chip area of the RC-IGBT, and is ultimately smaller than the chip area of an individual IGBT. However, heat itself is dissipated from the entire chip of the RC-IGBT. Thus, a heat dissipation area is defined by a chip area of the RC-IGBT, not by the area of an active region of a transistor in the RC-IGBT. Further, because the chip area of the RC-IGBT is larger than the chip area of an individual IGBT, the heat dissipation area of the RC-IGBT is larger than that of an individual IGBT. In this manner, the usage of RC-IGBTs as the transistors Q1 and Q2 can increase the area for dissipating heat generated due to steady-state losses, and can suppress chip temperature rise.

<Application in Two-Phase Three-Level I-Type Inverter>

Figure 16:
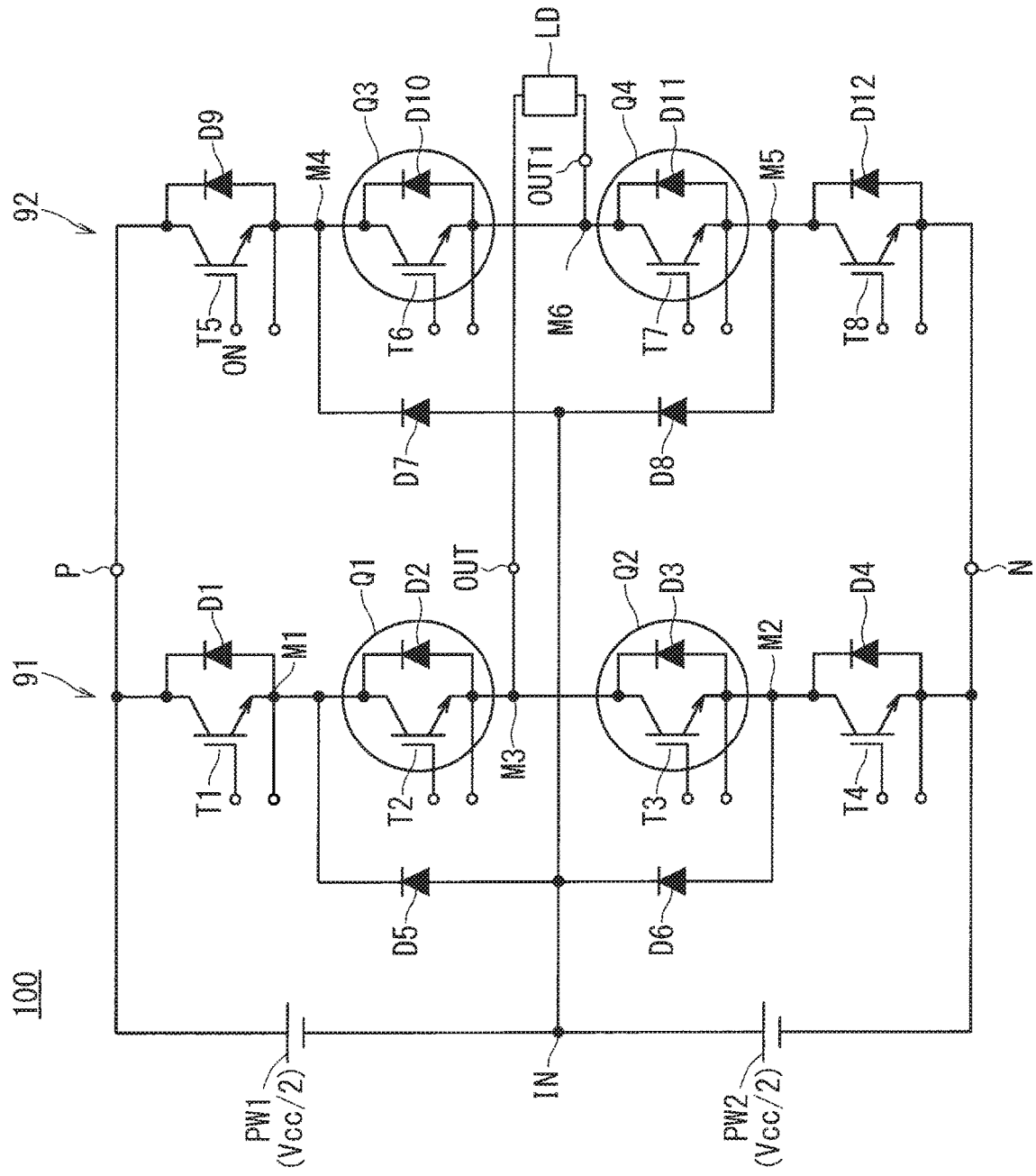
FIG. 16 is a circuit diagram of a two-phase three-level I-type inverter to which the present invention is applied.

FIG. 16 is a circuit diagram of a case in which this preferred embodiment is applied to a two-phase three-level I-type inverter. Note that, the same reference symbols are given to the same components of the two-phase three-level I-type inverter described above with reference to FIG. 5, and overlapping description will be omitted.

As shown in FIG. 16, in a half-bridge circuit 91 of a two-phase three-level I-type inverter 100, a transistor T2 and a diode D2 serve as a transistor Q1 formed of an RC-IGBT, and a transistor T3 and a diode D3 serve as a transistor Q2 formed of an RC-IGBT. Further, in a half-bridge circuit 92, a transistor T6 and a diode D10 serve as a transistor Q3 formed of an RC-IGBT, and a transistor T7 and a diode D11 serve as a transistor Q4 formed of an RC-IGBT.

Housing such a two-phase three-level 1-type inverter 100 in one package can reduce an attachment are, as compared to a case of forming a two-phase three-level I-type inverter by connecting with an external wire two semiconductor modules each including a one-phase three-level I-type inverter shown in FIG. 1.

<Application in Three-Phase Three-Level I-Type Inverter>

Figure 17:
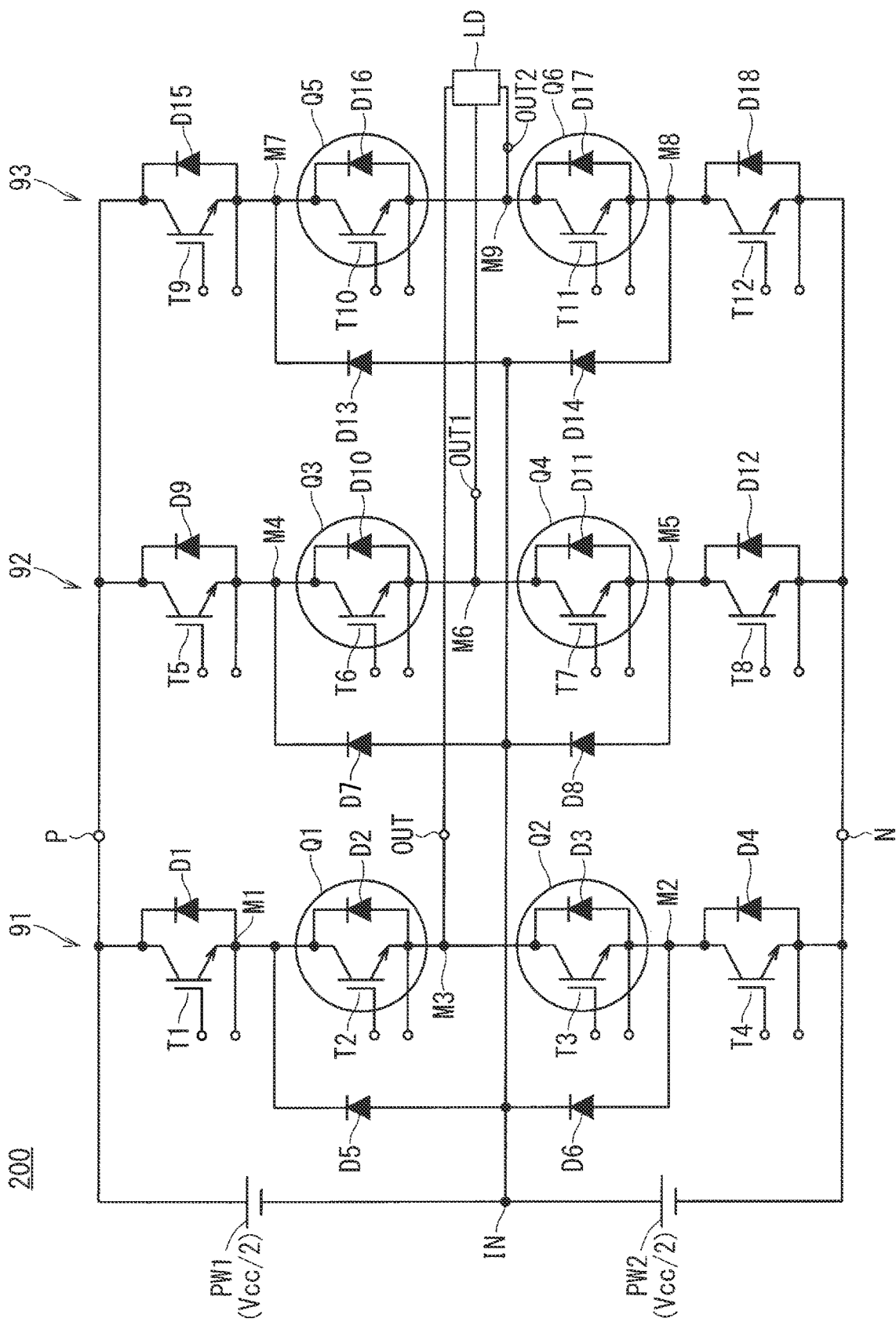
FIG. 17 is a circuit diagram of a three-phase three-level I-type inverter to which the present invention is applied.

FIG. 17 is a circuit diagram of a case in which this preferred embodiment is applied to a three-phase three-level I-type inverter. Note that, the same reference symbols are given to the same components of the two-phase three-level I-type inverter described above with reference to FIG. 16, and overlapping description will be omitted.

As shown in FIG. 17, a three-phase three-level I-type inverter 200 includes half-bridge circuits 91, 92, and 93, to which electric power is supplied by power supplies PW1 and PW2 connected in series.

In the half-bridge circuit 93, transistors T9, Q5, Q6, and T12 are connected in series in the mentioned order from a high potential side between a main power-supply node P having high potential and connected to a positive electrode of the power supply PW1 and a main power-supply node N having low potential and connected to a negative electrode of the power supply PW2.

The transistors T9 and T12 are IGBTs, and the transistors Q5 and Q6 are RC-IGBTs.

A collector of the transistor T9 is connected to the main power-supply node P, an emitter thereof is connected to a collector of the transistor Q5. An emitter of the transistor Q5 is connected to a collector of the transistor Q6. An emitter of the transistor Q6 is connected to a collector of the transistor T12. An emitter of the transistor T12 is connected to the main power-supply node N.

Between a connection node M7 of the transistor T9 and the transistor Q5 and a connection node M8 of the transistor Q6 and the transistor T12, diodes D13 and D14 are connected in anti-parallel with the series connection of the transistors Q5 and Q6. Note that, the diodes D13 and D14 serve as clamp diodes.

A connection node of the diodes D13 and D14 is connected to an input node IN, which serves as a connection node of the power supply PW1 and the power supply PW2. Further, a connection node M9 of the transistor Q5 and the transistor Q6 is connected to an output node OUT2 of the half-bridge circuit 93.

Diodes D15 and D18 are respectively connected to the transistors T9 and T12 in anti-parallel, and are connected to the transistors T9 and T12 as external diodes.

Meanwhile, the transistors Q5 and Q6 respectively include transistors T10 and T11 each being an IGBT, and diodes D16 and D17 are respectively connected to the transistors T10 and T11 in anti-parallel. The diodes D16 and D17 are built-in diodes formed in the same chip as the respective transistors T10 and T11.

Further, an output node OUT of the half-bridge circuit 91, an output node OUT1 of the half-bridge circuit 92, and the output node OUT2 of the half-bridge circuit 93 are connected to an inductive load LD.

Housing such a three-phase three-level I-type inverter 200 in one package can reduce an attachment area, as compared to a case of forming a three-phase three-level I-type inverter by connecting with an external wire three semiconductor modules each including a one-phase three-level I-type inverter shown in FIG. 1.

Second Preferred Embodiment

Figure 18:
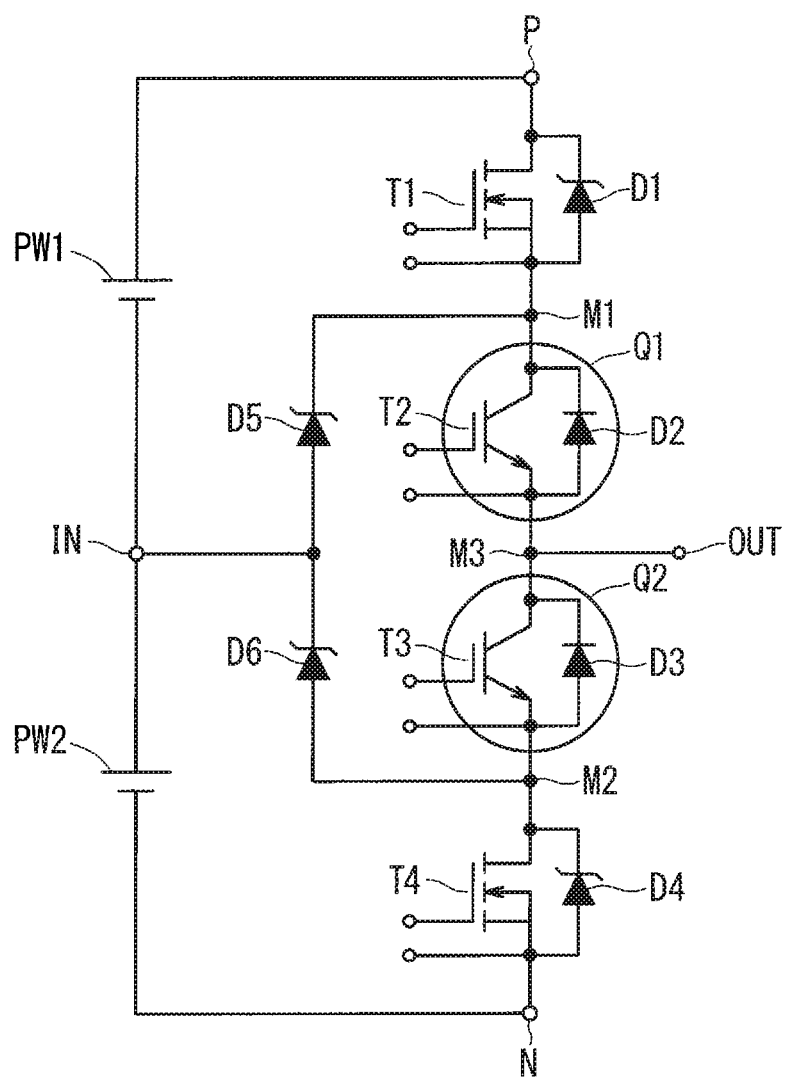
FIG. 18 is a circuit diagram showing a half-bridge circuit of a three-level I-type inverter according to a second preferred embodiment of the present invention.

FIG. 18 is a circuit diagram showing a half-bridge circuit 90A of a three-level I-type inverter according to a second preferred embodiment of the present invention.

As shown in FIG. 18, in a half-bridge circuit 90A of the three-level I-type inverter, electric power is supplied by power supplies PW1 and PW2 connected in series. Transistors T1, Q1, Q2, and T4 are connected in series in the mentioned order from a high potential side between a main power-supply node P having high potential and connected to a positive electrode of the power supply PW1 and a main power-supply node N having low potential and connected to a negative electrode of the power supply PW2.

The transistors T1 and T4 are N-channel silicon carbide metal oxide semiconductor (SiCMOS) transistors using silicon carbide (SiC) as a semiconductor material, and the transistors Q1 and Q2 are RC-IGBTs.

A drain of the transistor T1 is connected to the main power-supply node P, a source thereof is connected to a collector of the transistor Q1. An emitter of the transistor Q1 is connected to a collector of the transistor Q2. An emitter of the transistor Q2 is connected to a drain of the transistor T4. A source of the transistor T4 is connected to the main power-supply node N.

Between a connection node M1 of the transistor T1 and the transistor Q1 and a connection node M2 of the transistor Q2 and the transistor T4, diodes D5 and D6 are connected in anti-parallel with the series connection of the transistors Q1 and Q2. Note that, the diodes D5 and D6 are SiC Schottky barrier diodes using SiC as a semiconductor material, and serve as clamp diodes.

A connection node of the diodes D5 and D6 is connected to an input node IN, which serves as a connection node of the power supply PW1 and the power supply PW2. Further, a connection node M3 of the transistor Q1 and the transistor Q2 is connected to an output node OUT of the half-bridge circuit 90A.

Diodes D1 and D4 are respectively connected to the transistors T1 and T4 in anti-parallel. Note that, the diodes D1 and D4 are SiC Schottky barrier diodes, and are respectively connected to the transistors T1 and T4 as external diodes.

Meanwhile, the transistors Q1 and Q2 respectively include transistors T2 and T3 each being an IGBT, and diodes D2 and D3 are respectively connected to the transistors T2 and T3 in anti-parallel. The diodes D2 and D3 are built-in diodes formed in the same chip as the respective transistors T2 and T3.

As in the above description, in the three-level I-type inverter, switching losses generated when the transistors T1 and T4 are turned on or off are larger than switching losses generated when the transistors T2 and T3 are turned on or off. Thus, if each of the transistors T1 and T4 is formed of a SiCMOS transistor, which is known to have smaller switching losses than a silicon switching device using silicon (Si) as a semiconductor material, the switching losses of the transistors T1 and T4 can be reduced.

Further, if the diodes D1, D4, D5, and D6 are formed of SiC Schottky barrier diodes, switching losses can be reduced, because a SiC Schottky barrier diode hardly generates recovery losses.

In this manner, if the transistors T1 and T4 are formed of SiCMOS transistors and the diodes D1, D4, D5, and D6 are formed of SiC Schottky barrier diodes, switching losses can be further reduced, and temperature rise in each chip can be suppressed.

Note that, also in the half-bridge circuit 90A of the three-level I-type inverter according to the second preferred embodiment, an RC-IGBT is formed to have a larger chip area than an individual MOS transistor in plan view, and a heat dissipation area of the RC-IGBT is larger than that of an individual MOS transistor. Therefore, the usage of RC-IGBTs as the transistors Q1 and Q2 can increase the area for dissipating heat generated due to steady-state losses, and can suppress chip temperature rise.

Note that, in the present invention, each of the preferred embodiments may be freely combined, and each of the preferred embodiments may be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A three-level I-type inverter, comprising:
   between a first main power-supply node supplied with first potential and a second main power-supply node supplied with second potential that is lower than the first potential, first, second, third, and fourth switching devices that are connected in series in mentioned order from the first potential side;
   first, second, third, and fourth diodes that are respectively connected to the first, second, third, and fourth switching devices in anti-parallel; and
   between a connection node of the first and second switching devices and a connection node of the third and fourth switching devices, fifth and sixth diodes that are connected in series and in anti-parallel with the series connection of the second and third switching devices, wherein
   a connection node of the fifth and sixth diodes is connected to an input node that is supplied with intermediate potential between the first potential and the second potential,
   a connection node of the second and third switching devices is connected to an output node,
   the second switching device and the second diode are respectively formed of an IGBT and a diode that are included in a first reverse conducting IGBT, and
   the third switching device and the third diode are respectively formed of an IGBT and a diode that are included in a second reverse conducting IGBT,
   wherein
   the first switching device is an IGBT,
   a chip area of the first reverse conducting IGBT is larger than a chip area of the first switching device,
   the fourth switching device is an IGBT, and
   a chip area of the second reverse conducting IGBT is larger than a chip area of the fourth switching device.

2. The three-level I-type inverter according to claim 1, wherein
   a chip area of the first reverse conducting IGBT is larger than a chip area of the first switching device, and
   a chip area of the second reverse conducting IGBT is larger than a chip area of the fourth switching device.

3. A semiconductor module in which the three-level I-type inverter of claim 1 is housed in one package, wherein
   the first main power-supply node, the second main power-supply node, the input node, and the output node are disposed in line at a central portion of the package.

* * * * *